United States Patent [19]

Liepold et al.

[11] 4,205,772

[45] Jun. 3, 1980

[54] TERMINAL PIN INSERTION MACHINE

[75] Inventors: Gerhard Liepold, Watchung; Henry Traverso, Livingston, both of N.J.

[73] Assignee: General Staple Company, Inc., New York, N.Y.

[21] Appl. No.: 969,778

[22] Filed: Dec. 15, 1978

[51] Int. Cl.² .............................................. B23P 19/04
[52] U.S. Cl. ..................................... 227/115; 227/95; 227/116; 227/136
[58] Field of Search ................. 29/739; 227/114-116, 227/95, 97, 98, 135-137

[56] References Cited

U.S. PATENT DOCUMENTS

| | | | |
|---|---|---|---|
| 3,293,735 | 12/1966 | Lovendusky | 227/95 |
| 3,612,381 | 10/1971 | Schmidt | 227/95 |
| 3,641,647 | 2/1972 | Balmer | 29/739 |
| 3,739,446 | 6/1973 | Long, Jr. et al. | 29/739 |
| 3,805,356 | 4/1974 | Serrano | 29/739 |
| 3,975,811 | 8/1976 | Meyer | 29/739 |

Primary Examiner—John McQuade
Attorney, Agent, or Firm—Lerner, David, Littenberg & Samuel

[57] ABSTRACT

An apparatus and method is disclosed for inserting terminal pins into an apertured workpiece. The apparatus includes feeding means for sequentially advancing a supply strip of terminal pins integrally joined by intermediate web portions toward a first station of the apparatus; first clamping means for grasping the terminal pin adjacent the leading one of the terminal pins; second clamping means for grasping the leading one of the terminal pins; punch means for removing the intermediate web portion joining the leading one of the terminal pins and the terminal pin adjacent the leading one of the terminal pins; and insertion means for inserting the leading one of the terminal pins into the apertured workpiece.

24 Claims, 9 Drawing Figures

ND OF THE INVENTION

This invention relates to an apparatus for inserting elements such as electrical terminal pins into an apertured workpiece such as a printed circuit board, more particularly relates to such an apparatus which operates from a continuous supply strip of terminal pins integrally joined by intermediate web portions, and even more particularly, to such an apparatus in which the intermediate web portions joining adjacent terminal pins are removed prior to the insertion of the leading one of the terminal pins into the workpiece.

BACKGROUND OF THE INVENTION

In the fabrication of many electrical products, it is frequently necessary to establish a plurality of upstanding terminals on a substrate. For example, on printed circuit boards, it is necessary to establish terminal pins to which external wiring can be secured.

In U.S. Pat. No. 3,975,811, issued Aug. 24, 1976, and assigned to the assignee of the present invention, there is disclosed an apparatus for inserting terminal pins into a workpiece, such as a printed circuit board, which apparatus operates on a continuous supply strip of integrally connected terminal pins. In accordance with the invention disclosed in the aforementioned patent, the leading one of the terminal pins on the supply strip is grasped and, thereafer, moved forward past a shearing edge so that the lead pin is severed from the remainder of the supply strip at a point approximately halfway between the adjacent terminal pins. Thereafter, the severed terminal pin is driven into the workpiece.

Although the apparatus disclosed in the aforementioned U.S. Pat. No. 3,975,811 has enjoyed a certain degree of commercial success, there is one drawback associated therewith which the instant invention effectively eliminates. Specifically, with the apparatus of the aforementioned 3,975,811 patent, where a single shear operation takes place by passing the lead terminal past a shearing edge, the web joining adjacent terminal pins is effectively split down the middle, leaving each terminal pin with an undesirable shoulder or abutment protruding from opposite sides of the terminal pin proper. The enlarged central portion of the terminal pin created by these shoulder portions creates accuracy and tolerance problems vis-a-vis the apertures in the workpiece which have been preestablished and manufactured at a different location, and normally by a different manufacturer who may not be aware of the increased diameter of the central portion of the terminal pin occasioned by the aforementioned shoulder regions.

SUMMARY OF THE INVENTION

In accordance with the present invention, an apparatus and method are disclosed which, like the apparatus of the aforementioned '811 patent, includes feeding means for sequentially advancing a supply strip of terminal pins integrally joined by intermediate web portions toward a first station of the apparatus. First clamping means are provided for grasping the terminal pin adjacent the leading one of said terminal pins, and second clamping means are provided for grasping the leading one of the terminal pins. Thereafter, a punch moves forward to totally remove the intermediate web portion joining the leading one of the terminal pins with the terminal pin adjacent the leading one of the terminal pins. Finally, insertion means are provided for inserting the severed leading one of the terminal pins into the workpiece. In accordance with such invention, it will be appreciated that by totally removing the intermediate web portion joining adjacent pins, each terminal pin has exactly the dimensions of the pin body proper, and is not undesirably enlarged by any remaining portion of the intermediate web portions.

As a further feature of the invention, each of the respective first and second clamping means includes a clamping face and a movable clamping bar associated therewith. Each of the clamping faces includes a shearing edge which cooperates with the aforementioned punch to remove the intermediate web portions when the punch is operated. Further, each of the clamping faces is removable, whereby the shearing edges may be replaced as needed.

As a further feature, the second clamping means which holds the severed leading one of the pins, is movable from its first station to a second station where it is aligned with the aforementioned insertion means, preferably in the form of a vertically reciprocating holder which holds and drives the leading one of the terminal pins into the workpiece.

In the preferred form of the instant invention, all of the operations are operated by a plurality of cam wheels, all mounted on a single drive shaft.

Other features of the invention and a detailed description thereof may be had by referring to the following detailed description in conjunction with the drawings hereof.

DETAILED DESCRIPTION

Figure 2:
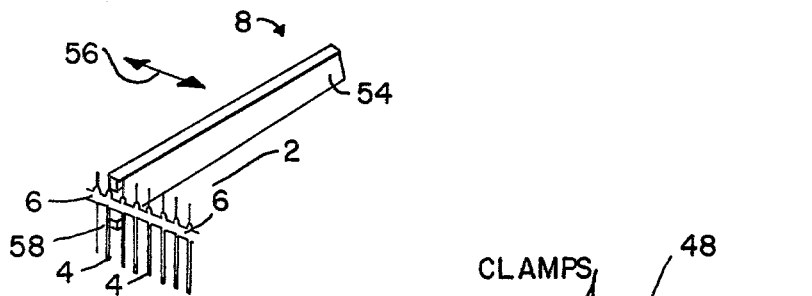
FIGS. 2-6 are partial views illustrating sequential steps performed by the apparatus of the present invention.
Figure 3:
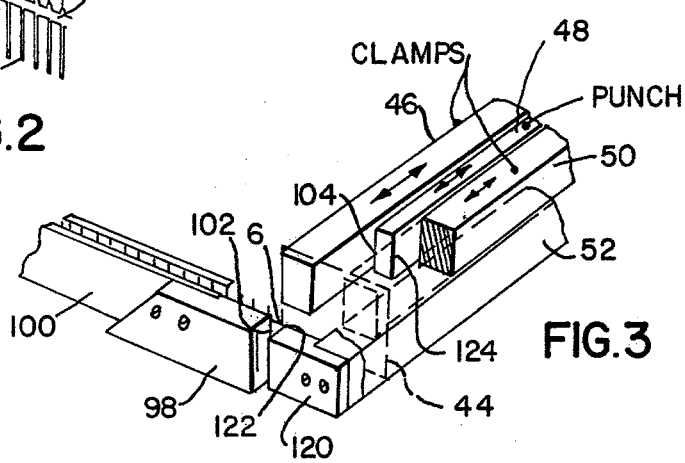
Figure 4:
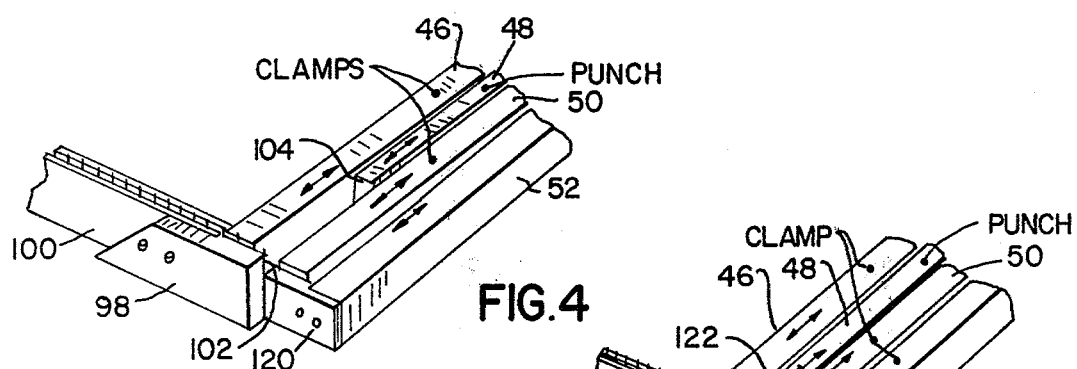
Figure 5:
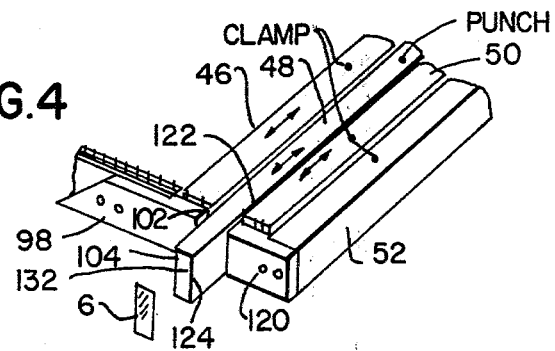

As noted above, the instant invention is directed to an apparatus employing a continuous supply strip for inserting terminals into a workpiece, such as a substrate or printed circuit board. As shown in FIG. 2, the supply strip 2 comprises a plurality of terminal pins 4 integrally connected by intermediate web portions 6. Although not shown in the drawings, it may be noted that the supply strip is preformed and prewound on a supply reel and sequentially fed to the apparatus 7 by feeding mechanism broadly designated 8 to be described in greater detail. Broadly speaking, the apparatus of the instant invention sequentially advances the supply strip 2 toward a first station, grasps the lead terminal pin and the terminal pin adjacent the lead terminal pin, punches out the intermediate web portion 6 between the lead pin and the pin adjacent thereto, and thereafter drives the lead pin into the workpiece. The workpiece is identified as W in FIG. 9.

Figure 7:
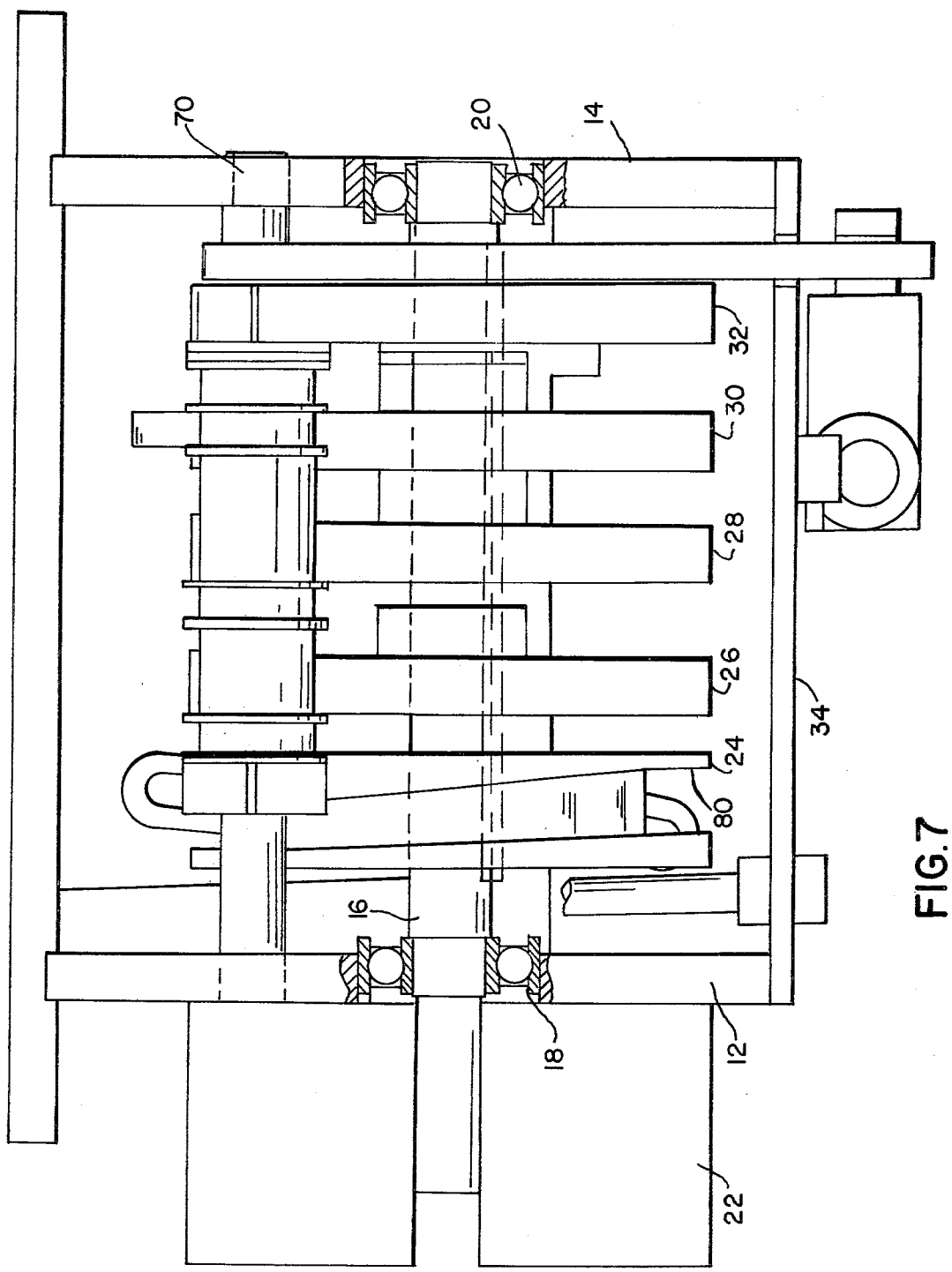
FIG. 7 is a top view of a portion of the apparatus of the present invention with the cover removed.

The apparatus includes a frame, generally designated 10, (FIG. 9) having a pair of side walls 12 and 14 (FIG. 7) carrying a main drive shaft 16 journaled for rotation by bearings 18 and 20. Shaft 16 is driven by an electric motor (not shown), the output of which is imparted to the shaft 16 through a conventional clutch 22. Shaft 16 fixedly carries cams 24, 26, 28, 30 and 32, the functions of which will be described in greater detail.

Supported between side walls 12 and 14 along the inner front face 34 of the frame is a block 36. Block 36 has a track 38 therein along which a guide block 40 may laterally reciprocate in the direction of double-headed arrow 42. Block 36 also includes an enlarged passageway 44 through which clamp 46, punch 48, clamp 50, and transport link 52 may pass in a manner to be further described.

Figure 8:
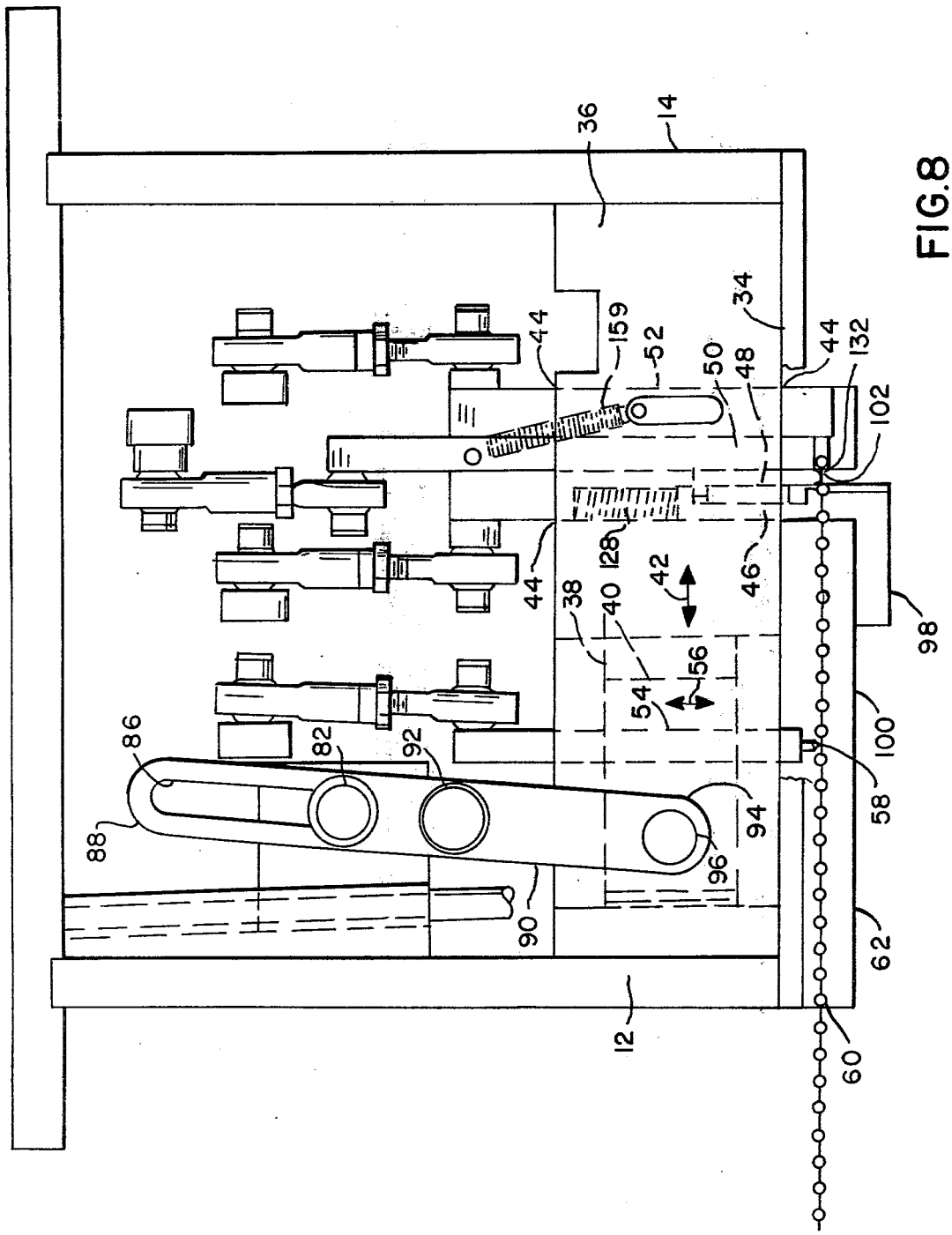
FIG. 8 is a view of a portion of the apparatus of the present invention taken below the cam arrangement shown in FIG. 1.

Feeding means 8 includes first and second cams 24 and 26, respectively, the guide block 40, and a feed pawl 54 which reciprocates in the direction of double-headed arrow 56. As shown in FIG. 2, the front face 58 of feed pawl 54 is recessed and has a width corresponding to the width of the web portions 6 joining the terminal pins 4. Thus, it will be appreciated that when the feed pawl 54 is brought forward and then laterally moved to the right as viewed in FIG. 2, the supply strip 2 will be sequentially advanced through a channelway 60 provided through an elongated guideblock 62 secured to the front face 34 of the frame (FIG. 8).

The aforementioned actions are effectuated by the first and second cams 24 and 26, respectively, in the following manner. Specifically, cam 26 includes a raceway 64 within which rides a follower 66 carried by a rocker arm 68, one end of which is pivotally mounted on shaft 70 carried between side walls 12 and 14 of the frame. The opposite end 71 of rocker arm 68 is pinned at 72 to one end of an adjustable turnbuckle arrangement 74, the opposite end 76 of which is pinned at 78 to the feed pawl 54.

Cam 24 includes an angled channelway 80 along its outer periphery within which rides a follower lug 82 having a depending stem 84 passing through an elongated slot 86 in one end 88 of a lever 90 mounted for pivotal rotation around fixed pivot pin 92. As shown in FIG. 8, the opposite end 94 of lever 90 is pinned at 96 to the upper surface of guide block 40.

Figure 1:
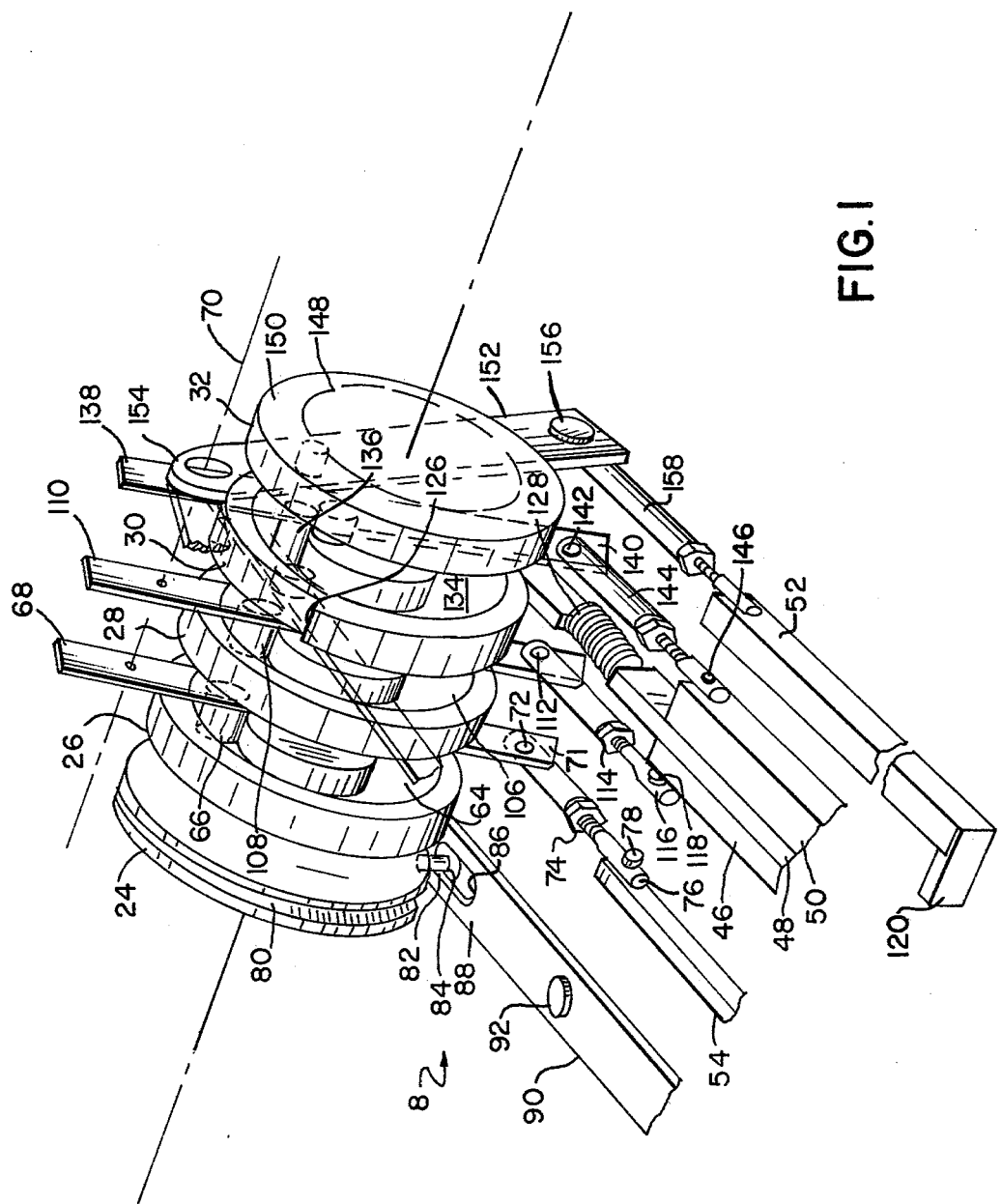
FIG. 1 is a perspective view of a portion of the apparatus of the present invention.

In operation, as the shaft 16 is driven, cams 24 and 26 are positioned so that first, rocker arm 68 rocks clockwise, as viewed in FIG. 1, about shaft 70 to drive feed pawl 54 forward into engagement with the supply strip in the manner shown in FIG. 2. While the feed pawl is in the forwardmost position, rotation of cam 24 laterally moves follower lug 82 and lever 90 counterclockwise about pivot 92 to move guide block 40 to the right as viewed in FIG. 8 to sequentially advance the supply strip 2 by one increment corresponding to the distance between adjacent terminal pins. Upon continued rotation of the drive shaft 16, and while other events, to be further described, are taking place, feed pawl 54 is withdrawn, and lever 90 is rotated in the opposite direction to move guide block 40 back to its starting position.

The first clamping means includes clamping bar 46 and a clamping face 98 removably secured to the front face 100 of elongated guide block 62 which, as mentioned previously, is secured on the front surface 34 of the frame. Clamping face 98 includes a shearing edge 102 which coacts with one edge 104 of the punch 48 in a manner to be further described. In this sequence of operations, the purpose of the first clamping means, including the clamping bar 46 and face 98, is to grasp and firmly hold the pin 4 adjacent to the lead pin 4 of the supply strip. This is accomplished in the following manner.

Referring to FIG. 1, third cam 28 includes a raceway 106 within which rides the follower 108 carried on rocker arm 110 mounted for pivotal motion about shaft 70. The opposite end of rocker arm 110 is pinned at 112 to one end of an adjustable turnbuckle 114 whose other end 116 is pinned at 118 to the clamping bar 46. Thus, as shaft 16 is rotated, the cams are positioned about the shaft such that after the supply strip has been advanced one position by the feeding means 8 previously described, the third cam causes the clockwise rocking or rocker arm 110 about shaft 70 to cause the clamping bar 46 to move forward and grasp the pin 4 adjacent the lead pin firmly against the fixed face 98.

The function of the second clamping means is to grasp the lead pin 4. This is effected by forward motion of clamping bar 50 toward fixed face 120 removably carried on the end of transport link 52. Fixed face 120 includes a shearing edge 122 which coacts with an edge 124 of the punch 48.

To drive the clamp 50 forward, the fourth cam 30 includes a raceway 134 within which rides a follower 136 carried by rocker arm 138, one end of which is rotatable about shaft 70. The opposite end 140 of rocker arm 138 is pinned at 142 to adjustable turnbuckle 144 whose opposite end is pinned at 146 to the clamp 50. Consequently, rotation of the cam 30 causes rocking motion of the rocker arm 138 to advance and retract the second clamp 50.

The result is that the lead pin is firmly grasped between clamping bar 50 and face 120. As a result, the web portion 6 which joins the two lead pins is situated squarely in front of the front face 132 of the punch 48. At this point in time, the punch 48 is driven forward with its respective edges 104 and 124 cooperating with shearing edges 102 and 122, respectively, on faces 98 and 120 to cleanly sever and remove the intermediate web portion 6 from the lead pin and the pin adjacent thereto.

To drive the punch 48, the outer surface of the fourth cam 30 includes a stepped shoulder 126 which drives the punch 48 forward. A spring 128 actually separates punch 48 into two pieces and permits retraction.

Once the punch 48 has removed the web portion 6, the lead pin 4 remains grasped between clamping bar 50 and the fixed face 120 carried by the transport link 52. The severed lead pin is now ready to be inserted into the workpiece in the following manner.

Figure 6:
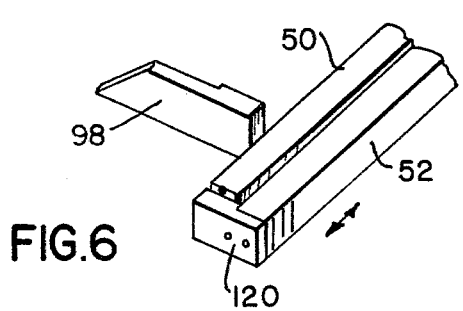

Specifically, referring to FIG. 1, the inside surface of the fifth cam 32 includes a raceway 148 in which rides a cam follower 150 carried by rocker arm 152, one end of which, 154, is mounted for rotation around shaft 70, the opposite end 156 of which is pinned to adjustable turn buckle 158, in turn connected to transport link 52. Thus, in proper timed relationship, upon rotation of the fifth cam 32, rocker arm 152 will be rocked about shaft 70 to advance the transport link 52 carrying the fixed face 120 thereon to a forward position illustrated in FIG. 6. The second clamping bar 50 follows this motion under the pulling action of a spring 159 (FIG. 8). Thus, the lead pin 4 is firmly grasped as it is moved forward by the simultaneous forward motion of the face 120 and clamping bar 50.

The lead pin 4 comes to rest aligned under a reception well 160 carried by a vertically reciprocating holder and driver 162. Driver 162 is driven by a bell crank lever 164 in the following manner.

Figure 9:
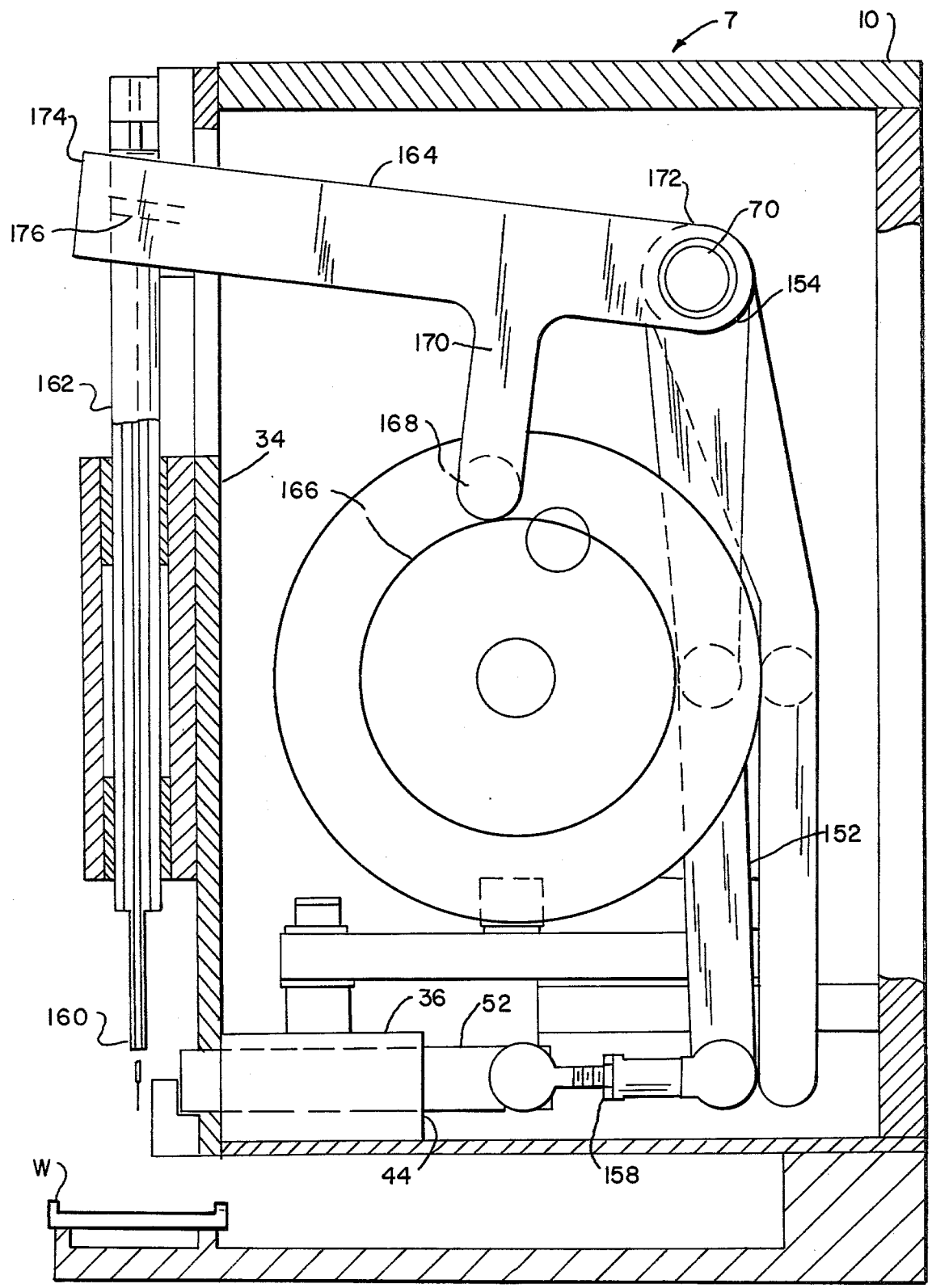
FIG. 9 is a side elevational view of the apparatus of the present invention.

Specifically, as best seen in FIG. 9, a second surface of the fifth cam 32 includes a raceway 166 within which rides a follower 168 carried on the short arm 170 of the bell crank lever 164. One end 172 of the long arm of the bell crank lever 164 is mounted for rotation about shaft 70, and the opposite end 174 is pinned at 176 to the driver 162. Thus, under the influence of the fifth cam 32, after the lead pin has been transported to its forwardmost position, the driver 162 descends so that the pin is received within the well 160, whereby continued downward motion of the driver 162 will cause the pin to be driven into the workpiece W. It should be noted that just as the driver descends upon the lead pin, the transport link continues to be moved slightly forward (under the influence of cam 32) and the second clamping bar 50 begins to retract, thereby making room for the head of the driver 162 to complete its downward descent to drive the lead pin into the workpiece.

It will be appreciated that the aforedescribed cycle may be repeated in cyclic fashion quite rapidly, owing to the extreme simplicity of the mechanism, and especially to the arrangement of all of the operating cams being driven by a single drive shaft.

Although this invention has been described with respect to its preferred embodiments, it should be understood that many variations and modifications will now be obvious to those skilled in the art, and it is preferred, therefore, that the scope of the invention be limited, not by the specific disclosure herein, but only by the appended claims.

What is claimed is:

1. Apparatus for inserting terminal pins into a workpiece; said apparatus comprising:
    feeding means for sequentially advancing a supply strip of terminal pins integrally joined by intermediate web portions toward a first station of said apparatus;
    first clamping means for grasping the terminal pin adjacent the leading one of said terminal pins;
    second clamping means for grasping said leading one of said terminal pins;
    punch means for removing the intermediate web portion joining said leading one of said terminal pins and said terminal pin adjacent said leading one of said terminal pins; and
    insertion means for inserting said leading one of said terminal pins into said workpiece.

2. The apparatus of claim 1, wherein said insertion means includes vertically reciprocating holder means for holding and driving said leading one of said terminal pins into said workpiece.

3. The apparatus of claim 2, wherein said holder means includes a reception well in which said leading one of said terminal pins is held while being driven into said workpiece.

4. The apparatus of claim 2, and further including transport means for transporting said leading one of said terminal pins from said first station to a second station aligned with said vertically reciprocating holder means.

5. The apparatus of claim 3, and further including transport means for transporting said leading one of said terminal pins from said first station to a second station aligned with said reception well of said holder means.

6. The apparatus of claim 1, wherein said first clamping means includes a first clamping face and a first movable clamping bar.

7. The apparatus of claim 6, wherein said first clamping face includes a first shearing edge which cooperates with said punch means.

8. The apparatus of claim 7, wherein said first clamping face is removable from said apparatus to facilitate replacement of said first shearing edge.

9. The apparatus of claim 6, wherein said second clamping means includes a second clamping face and a second movable clamping bar.

10. The apparatus of claim 9, wherein said second clamping face includes a second shearing edge which cooperates with said punch means.

11. The apparatus of claim 10, wherein said second clamping face is removable from said apparatus to facilitate replacement of said second shearing edge.

12. The apparatus of claim 9, wherein said insertion means includes vertically reciprocating holder means for holding and driving said leading one of said terminal pins into said workpiece, and further including transport means for transporting said leading one of said terminal pins from said first station to a second station aligned with said vertically reciprocating holder means, said second clamping face carried by said transport means.

13. The apparatus of claim 12, wherein said second clamping face and said second clamping bar with said leading one of said terminal pins held therebetween are moved by said transport means to transport said leading one of said terminal pins from said first station to said second station.

14. The apparatus of claim 13, wherein said first clamping face includes a first shearing edge which cooperates with said punch means, and wherein said second clamping face includes a second shearing edge which cooperates with said punch means.

15. The apparatus of claim 4, wherein said second clamping means includes a clamping face and a movable clamping bar.

16. The apparatus of claim 15, wherein said clamping face and said second clamping bar with said leading one of said terminal pins held therebetween are moved by said transport means to transport said leading one of said terminal pins from said first station to said second station.

17. The apparatus of claim 16, wherein said clamping face includes a shearing edge which cooperates with said punch means.

18. The apparatus of claim 1, wherein said feeding means includes a feed pawl movable in a first direction into the path of movement of said supply strip and movable in a second direction transverse to said first direction to advance said supply strip toward said first station.

19. The apparatus of claim 18, wherein said feeding means further includes a guide block through which said feed pawl reciprocates in said first direction.

20. The apparatus of claim 19, and further including first cam means for reciprocating said guide block in said second direction, and second cam means for reciprocating said feed pawl in said first direction.

21. The apparatus of claim 20, and further including third cam means for operating said first clamping means.

22. The apparatus of claim 21, and further including fourth cam means for operating said second clamping means and said punch means.

23. The apparatus of claim 22, wherein said insertion means includes vertically reciprocating holder means for holding and driving said leading one of said terminal pins into said workpiece; further including transport means for transporting said leading one of said terminal pins from said first station to a second station aligned with said vertically reciprocating holder means; and further including fifth cam means for operating said transport means and said insertion means.

24. The apparatus of claim 23, wherein said first, second, third, fourth and fifth cam means are all operated off of a common drive shaft.

* * * * *